United States Patent
Wei et al.

(10) Patent No.: US 8,605,437 B2
(45) Date of Patent: Dec. 10, 2013

(54) COOLING APPARATUS AND ELECTRONIC EQUIPMENT

(75) Inventors: Jie Wei, Kawasaki (JP); Keizou Takemura, Kawasaki (JP); Kenji Katsumata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 110 days.

(21) Appl. No.: 13/042,573

(22) Filed: Mar. 8, 2011

(65) Prior Publication Data
US 2012/0057302 A1  Mar. 8, 2012

(30) Foreign Application Priority Data
Mar. 10, 2010  (JP) .................................. 2010-52543

(51) Int. Cl.
*H05K 7/20* (2006.01)
(52) U.S. Cl.
USPC .......................................... 361/699; 361/702
(58) Field of Classification Search
None
See application file for complete search history.

(56) References Cited

U.S. PATENT DOCUMENTS

| 6,665,183 | B1 * | 12/2003 | Shikata et al. ................. 361/697 |
| 7,215,542 | B2 * | 5/2007 | Chen et al. ..................... 361/694 |
| 7,265,985 | B2 * | 9/2007 | Widmayer et al. ............. 361/721 |
| 7,675,752 | B2 * | 3/2010 | Hongo ........................... 361/700 |
| 7,800,901 | B2 * | 9/2010 | Borowy et al. ................ 361/690 |
| 8,159,820 | B2 * | 4/2012 | Ibori et al. ..................... 361/695 |
| 2005/0029241 | A1 * | 2/2005 | Miao Spear .................. 219/130.1 |
| 2007/0183126 | A1 * | 8/2007 | Tilton et al. ................... 361/699 |
| 2009/0046426 | A1 * | 2/2009 | Ishikawa ....................... 361/695 |
| 2009/0129020 | A1 * | 5/2009 | Fujiwara ....................... 361/697 |

FOREIGN PATENT DOCUMENTS

| JP | 02-106896 | 8/1990 |
| JP | 08-186388 | 7/1996 |
| JP | 09-283958 | 10/1997 |
| JP | 2008-287733 | 11/2008 |

OTHER PUBLICATIONS

Japanese Office Action mailed Oct. 1, 2013 for corresponding Japanese Application No. 2010-052543, with partial English-language translation.

* cited by examiner

*Primary Examiner* — Hoa C Nguyen
*Assistant Examiner* — Xanthia C Cunningham
(74) *Attorney, Agent, or Firm* — Fujitsu Patent Center

(57) ABSTRACT

A cooling apparatus that cools first and second high density heat dissipation components provided in a housing including a fan that provide an air convection from one opening toward the other opening, the cooling apparatus having: a conduit that contacts the first heat dissipation component and that allows a coolant to pass there through; and a fin structure that contacts the conduit and that is provided on an upwind side of the second heat dissipation component.

15 Claims, 12 Drawing Sheets

COOLING APPARATUS AND ELECTRONIC EQUIPMENT

CROSS-REFERENCE TO RELATED APPLICATION

This application is based upon and claims the benefit of priority from the prior Japanese Patent Application No. 2010-052543 filed on Mar. 10, 2010, the entire contents of which are incorporated herein by reference.

FIELD

The embodiments discussed herein relate to cooling of an electronic component.

BACKGROUND

A liquid-cooling scheme is known as a technology for cooling a high density heat dissipation component such as an LSI (Large Scale Integrated circuit) installed in an electronic equipment.

A liquid-cooling system in which a cooling component with an internal cavity is mounted on an LSI like a CPU (Central Processing Unit) chip and in which a cooling liquid is circulated between the cooling component and a radiator using a pump is known as an example implementing such a technology (see Japanese Laid-Open Patent Publication No. 8-186388 and Japanese Laid-Open Patent Publication No. 2008-287733, for example).

In the liquid-cooling scheme, it is required that a tubing system for circulation of the cooling liquid (coolant) be provided between the cooling component mounted on the high density heat dissipation component and the radiator. In addition, a radiator and a plurality of cooling components are generally connected through the tubing pipes. The pipes serve as a circulation path through which the coolant passes.

In general, it is difficult to design the tubing and cooling system such that all the high density heat dissipation components intricately disposed on a system board are cooled.

In many cases, an air-cooling scheme may also be applied for some of the low power electronic components, rather than cooling all the components by the liquid-cooling scheme, that is, a hybrid cooling scheme will be more effective.

In order to enhance the cooling capability in the air-cooling scheme, the temperature of air for cooling is preferably low. The temperature of the air may be lowered by installing an air-cooling apparatus external to an electronic apparatus and setting the temperature of the air for cooling to a lower temperature. However, this approach may increase the amount of electric power consumed by the air-cooling apparatus.

SUMMARY

According to an embodiment, a cooling apparatus that cools first and second heat dissipation components provided in a housing including a fan that sends a wind from one opening toward the other opening, the cooling apparatus having: a conduit that contacts the first heat dissipation component and that allows a coolant to pass there through; and a fin that contacts the conduit and that is provided on an upwind side of the second heat dissipation component.

It is to be understood that both the foregoing summary description and the following detailed description are explanatory as to some embodiments of the present invention, and not restrictive of the present invention as claimed.

DESCRIPTION OF EMBODIMENTS

First Embodiment

Figure 1:
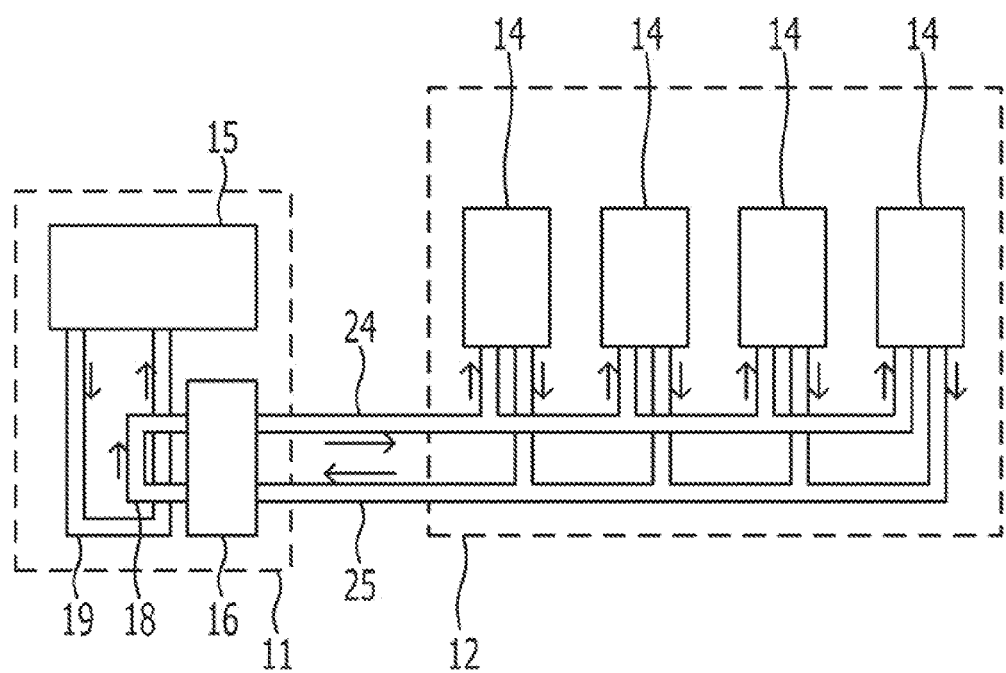
FIG. 1 is a block diagram of a liquid-cooling mechanism for a data center.

FIG. 1 is a block diagram of a liquid-cooling mechanism in a data center. The data center includes a computer room 12 in which a plurality of computer rack cabinets 14 each housing system boards are installed, and a cooling chiller 11 for coolant heat exchanging. The liquid-cooling mechanism includes the cooling chiller 11 which cools cooling water (coolant), a feed pipe 24 that distributes the cooling water cooled in the cooling chiller 11 to supply the cooling water into the plurality of rack cabinets 14 in the computer room 12, and a return pipe 25 that merges the cooling water heated from absorbing heat in the plurality of rack cabinets 14 to return the cooling water to the cooling chiller 11. That is, the liquid-cooling mechanism circulates the cooling water between the cooling chiller 11 and the rack cabinets 14 to cool the rack cabinets 14.

The chiller 11 includes a refrigerant pipe 19 through which the refrigerant (cooling medium) passes, a refrigerator 15 that circulates the refrigerant in the refrigerant pipe 19 and cools the refrigerant, a cooling pipe 18 which is provided in contact with the refrigerant pipe 19 and through which the cooling water from the return pipe 25 passes, and a cooling water pump 16 that sucks the cooling water from the cooling pipe 18 to discharge the cooling water to the feed pipe 24. The cooling pipe 18 and the refrigerant pipe 19 contact each other. Therefore, the inside of the cooling pipe 18 is cooled, and the cooling water flowing into the cooling pipe 18 is cooled. The cooling water which has been cooled flows from the cooling pipe 18 to the feed pipe 24.

Figure 2:
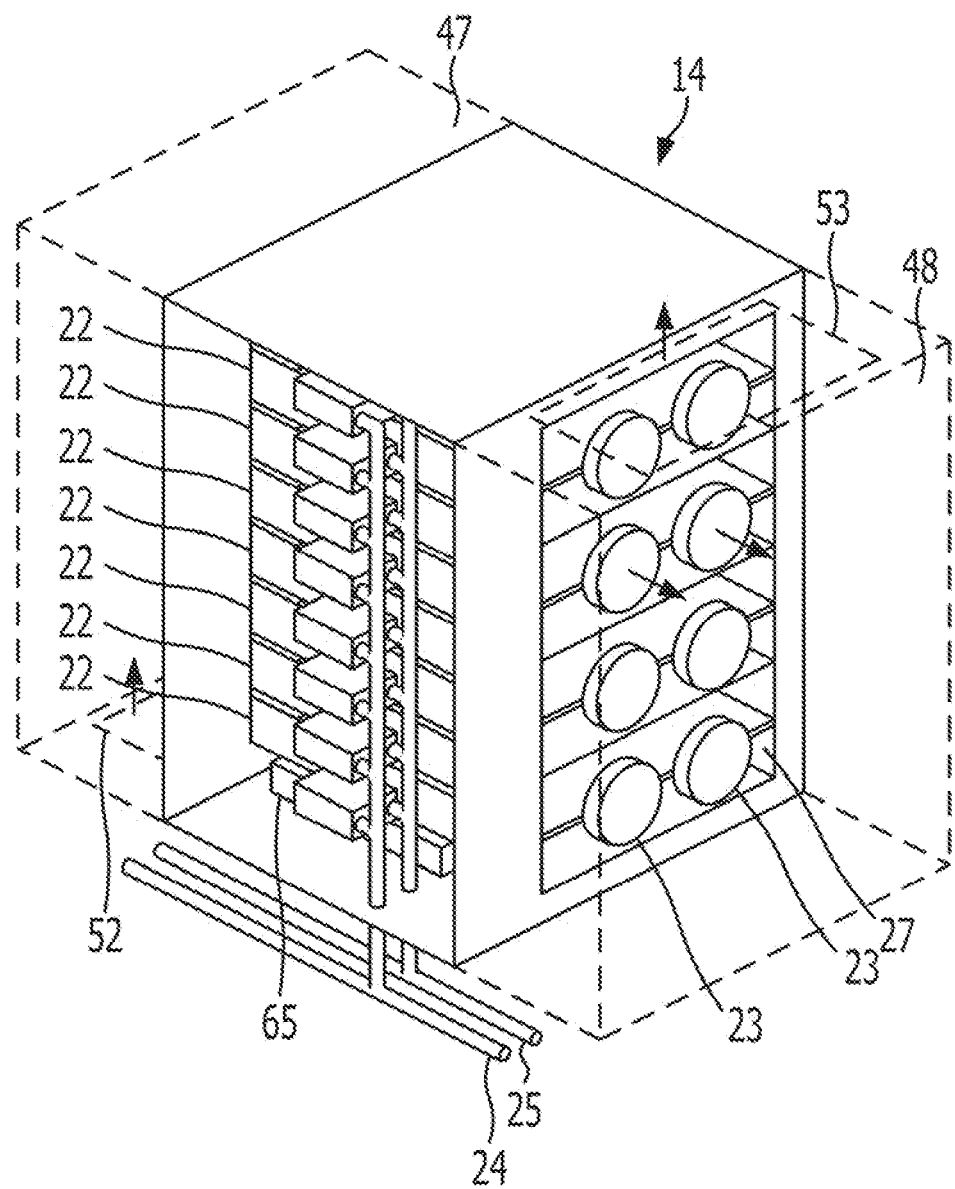
FIG. 2 is a perspective view of a electronic rack cabinet.
Figure 3:
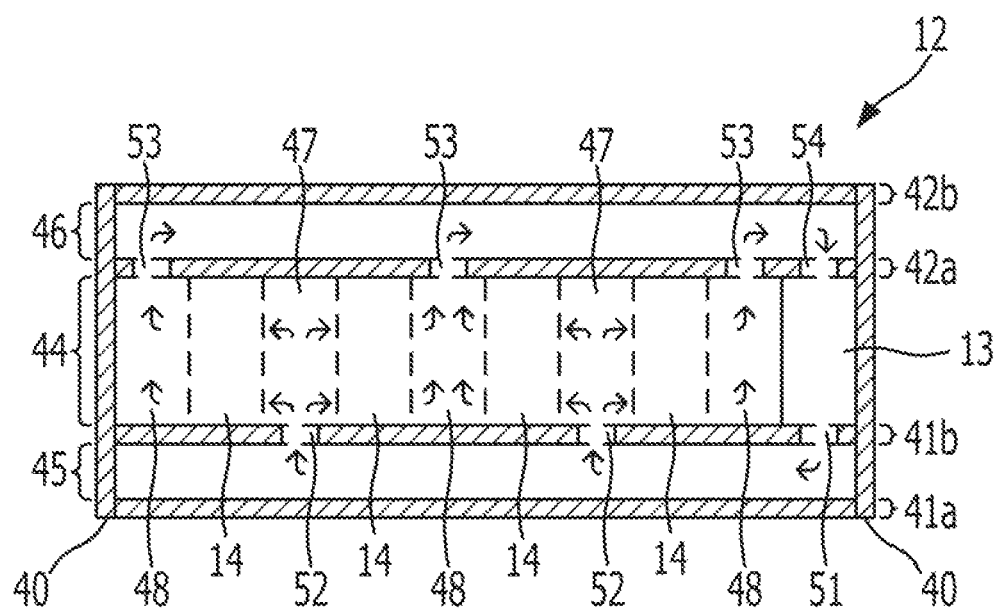
FIG. 3 schematically illustrates an air-cooling mechanism of a computer room.

FIG. 2 is a perspective view of the rack cabinet 14. FIG. 3 schematically illustrates an air-cooling mechanism for the computer room 12. As illustrates in FIG. 2, the rack cabinet 14 includes a cabinet wall 27, and houses a plurality of system boards 22 arranged in the height direction along the cabinet wall 27. The rack cabinet 14 further includes a power-supply section 65 that supplies electric power to the plurality of system boards 22. The feed pipe 24 and the return pipe 25 from the chiller 11 are disposed along a side surface opposite the cabinet wall 27, and rise up from a space under the rack cabinet 14 to be connected to each of the system boards 22 in the rack cabinet 14. The feed pipe 24 distributes the cooling water supplied into the single rack cabinet 14 to supply the cooling water to the plurality of system boards 22. The return pipe 25 merges the cooling water returned from the plurality of system boards 22 in the single rack cabinet 14 to return the cooling water to the chiller 11.

According to the liquid-cooling mechanism discussed above, the plurality of system boards 22 are cooled using the cooling water cooled in the cooling chiller 11.

Next, the air-cooling mechanism for the computer room 12 will be described.

As illustrated in FIG. 3, the computer room 12 has double flooring (a raised floor) and double ceiling (a ventilating ceiling).

The computer room 12 further has a lower ventilation path 45 that is the lowermost space in the computer room 12 and that is a space between a floor 41a and a floor 41b. The computer room 12 further has an upper ventilation path 46 that is a space above a computer housing section 44 and that is a space between the ceiling 42a and a ceiling 42b. The computer room 12 further has the computer housing section 44 which is a space between the floor 41b and the ceiling 42a. The floor 41b has an air-conditioner discharge hole 51 serving as a ventilation hole that passes air from an air conditioner 13 to the lower ventilation path 45, and a plurality of floor ventilation holes 52 serving as ventilation holes that pass air from the lower ventilation path 45 to the computer housing section 44. The ceiling 42a has a plurality of ceiling ventilation holes 53 serving as ventilation holes that pass air from the computer housing section 44 to the upper ventilation path 46, and an air-conditioner suction hole 54 serving as a ventilation hole that passes air from the upper ventilation path 46 to the air conditioner 13.

The computer housing section 44 includes the air conditioner 13 which circulates air in the computer room 12 and which cools the air. The air conditioner 13 sucks air from the upper ventilation path 46 via the air-conditioner suction hole 54, cools the sucked air, and discharges the cooled air to the lower ventilation path 45 via the air-conditioner discharge hole 51.

Of a plurality of spaces in the computer housing section 44 partitioned by the rack cabinets 14, intake ventilation paths 47 communicate with the floor ventilation holes 52 to guide the air from the lower ventilation path 45 into the rack cabinets 14, and exhaust ventilation paths 48 communicate with the ceiling ventilation holes 53 to guide the air from inside the rack cabinets 14 to the upper ventilation path 46. The arrows provided on the floor ventilation holes 52 in FIG. 2 indicate the direction of a wind flowing from the lower ventilation path 45 to the intake ventilation paths 47 via the floor ventilation holes 52. The arrows provided on the ceiling ventilation holes 53 in FIG. 2 indicate the direction of a wind flowing from the exhaust ventilation paths 48 to the upper ventilation path 46 via the ceiling ventilation holes 53.

The rack cabinet 14 has openings in side surfaces that are adjacent to the side surface along which the feed pipe 24 and the return pipe 25 are disposed and that are respectively on the intake ventilation path 47 side and on the exhaust ventilation path 48 side. As illustrated in FIG. 2 discussed above, the rack cabinet 14 further includes a plurality of fans 23 provided in the openings on the exhaust ventilation path 48 side to exhaust air in the rack cabinet 14 to the exhaust ventilation path 48. This allows the air flowing in the intake ventilation path 47 to flow into the rack cabinet 14 through the openings on the intake ventilation path 47 side, to flow horizontally in the rack cabinet 14, and to flow out to the exhaust ventilation path 48 through the openings on the exhaust ventilation path 48 side. The arrows provided on the fans 23 in FIG. 2 indicate the direction of a wind flowing from the rack cabinet 14 to the exhaust ventilation path 48. The rack cabinet 14 may include fans provided in the openings on the intake ventilation path 47 side to suck air.

According to the air-cooling mechanism discussed above, the air cooled by the air conditioner 13 and discharged from the air conditioner 13 flows into the lower ventilation path 45 via the air-conditioner discharge hole 51, flows into the intake ventilation paths 47 via the floor ventilation holes 52, and flows into the rack cabinets 14. The air flowing out from inside the rack cabinets 14 into the intake ventilation paths 47 flows into the upper ventilation path 46 via the ceiling ventilation holes 53, is sucked by the air conditioner 13 via the air-conditioner suction hole 54, and is cooled again by the air conditioner 13.

Electronic circuit components on the system board 22, the liquid-cooling mechanism, and the air-cooling mechanism according to the first embodiment will be described below.

First, the electronic circuit components on the system board 22 will be described.

Figure 4:
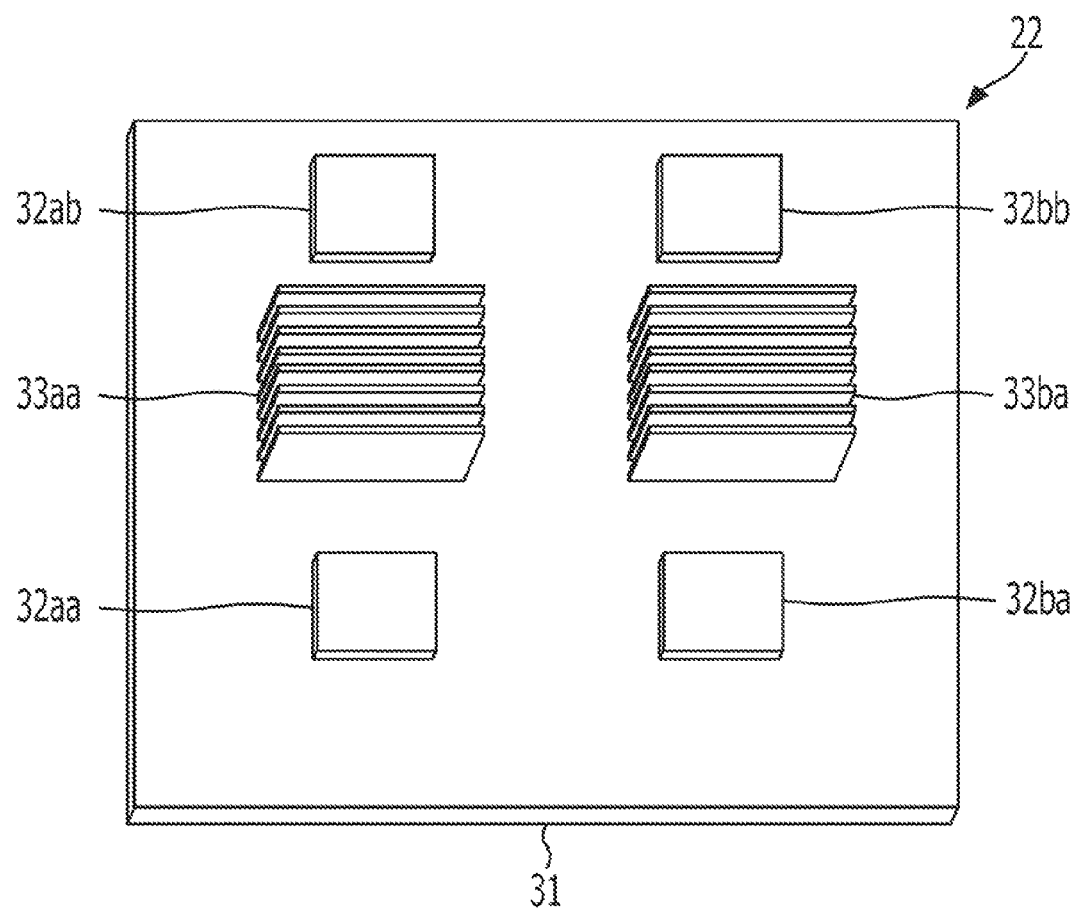
FIG. 4 is a perspective view illustrating the arrangement of electronic circuit components on a system board according to a first embodiment.
Figure 5:
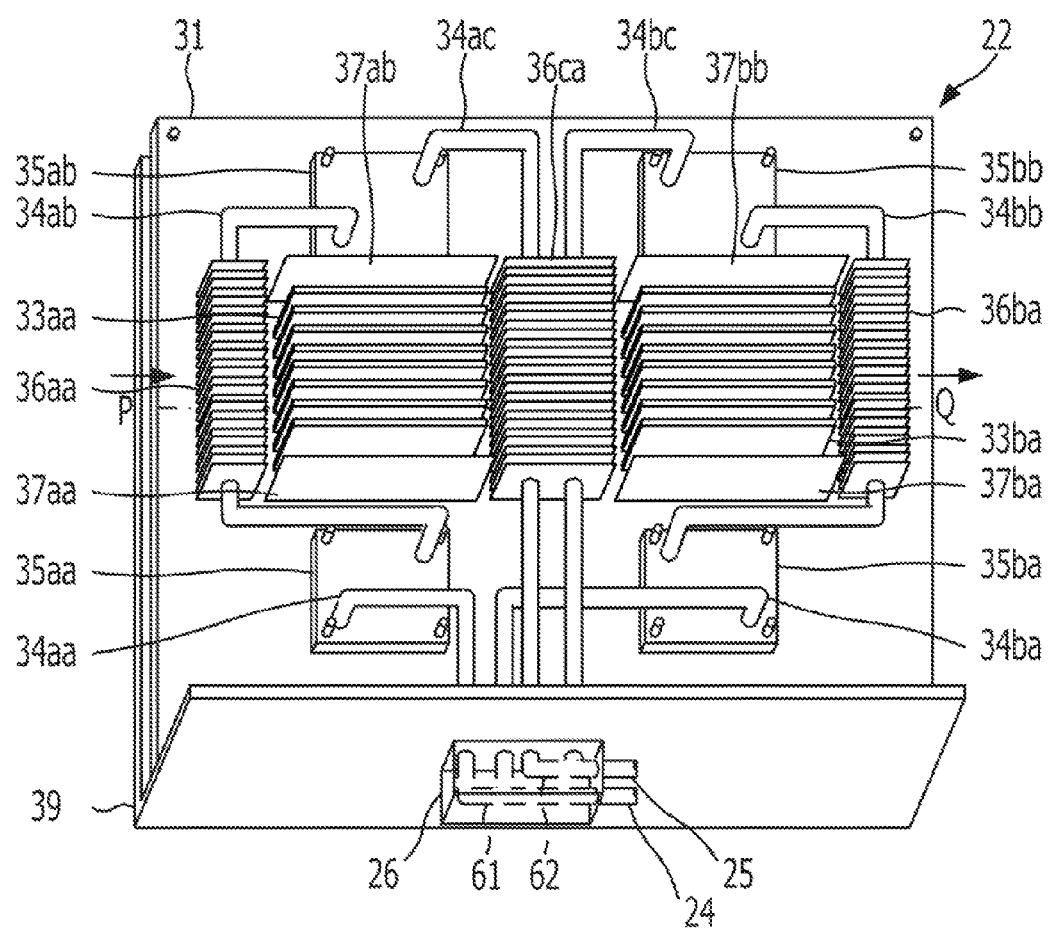
FIG. 5 is a perspective view of the system board and the liquid-cooling mechanism according to the first embodiment.

FIG. 4 is a perspective view illustrating the arrangement of the electronic circuit components on the system board 22 according to the first embodiment. FIG. 5 is a perspective view of the system board 22 and the liquid-cooling mechanism according to the first embodiment. As illustrated in FIG. 4, the system board 22 includes a main substrate 31 that is a flat rectangular plate. The system board 22 further includes chip components 32*aa*, 32*ab*, 32*ba*, and 32*bb* respectively disposed near the four corners of the main substrate 31. Of the four corners of the main substrate 31, the chip components 32*aa* and 32*ba* are positioned on the side on which the feed pipe 24 and the return pipe 25 for the rack cabinet 14 are disposed. The system board 22 further includes a plurality of sub substrates 33*aa* that are flat plates provided vertically with respect to the main substrate 31 and provided between the chip component 32*aa* and the chip component 32*ab*. The system board 22 further includes a plurality of sub substrates 33*ba* that are flat plates provided vertically with respect to the main substrate 31 and provided between the chip component 32*ba* and the chip component 32*bb*. The plurality of sub substrates 33*aa* are disposed in parallel with each other, and arranged in the direction of a line connecting the chip components 32*aa* and 32*ab* at sub substrate intervals. The plurality of sub substrates 33*ba* are disposed in parallel with each other, and arranged in the direction of a line connecting the chip components 32*ba* and 32*bb* at sub substrate intervals.

The chip components 32*aa*, 32*ab*, 32*ba*, and 32*bb* may each be an LSI such as a CPU, for example, and produce heat as the circuit operates. The sub substrates 33*aa* and 33*ab* may each be a memory board such as a DIMM (Dual Inline Memory Module), for example, and produce heat as the circuit operates.

Next, the liquid-cooling mechanism for the system board 22 will be described.

As illustrated in FIG. 5, the system board 22 is further provided with liquid circulation cooling components 35*aa*, 35*ab*, 35*ba*, and 35*bb* that closely contact the respective upper flat surface portions of the chip components 32*aa*, 32*ab*, 32*ba*, and 32*bb* illustrated in FIG. 4. The liquid circulation cooling components 35*aa*, 35*ab*, 35*ba*, and 35*bb* have an internal cavity, and have an inlet port and an outlet port formed in the respective upper walls to allow cooling water to flow in and out. Examples of the liquid circulation cooling components 35aa, 35ab, 35ba, and 35bb include a water-cooled cooling plate, a coolant jacket, and a water block.

The system board 22 is further provided with a chassis 39 that supports an end portion of the main substrate 39 on the side of the chip components 32aa and 32ba and the lower surface of the main substrate 31, and a pipe connection portion 26 provided at an end portion of the chassis 39 on the side of the chip components 32aa and 32ba to be connected to the feed pipe 24 and the return pipe 25. The pipe connection portion 26 includes a feed connection pipe 61 having one inlet port and two outlet ports and a return connection pipe 62 having two inlet ports and one outlet port. The feed connection pipe 61 distributes the cooling water from the feed pipe 24 connected to the inlet port to guide the cooling water to board pipes 34aa and 34ba respectively connected to the two outlet ports. The return connection pipe 62 merges the cooling water from board pipes 34ac and 34bc respectively connected to the two inlet ports to guide the cooling water to the return pipe 25 connected to the outlet port.

The system board 22 is further provided with the board pipe 34aa which guides the cooling water from the feed connection pipe 61 to the inlet port of the liquid circulation cooling component 35aa, a board pipe 34ab that guides the cooling water from the outlet port of the liquid circulation cooling component 35aa to the inlet port of the liquid circulation cooling component 35ab, and the board pipe 34ac which guides the cooling water from the outlet port of the liquid circulation cooling component 35ab to the return connection pipe 62. The system board 22 is further provided with the board pipe 34ba which guides the cooling water from the feed connection pipe 61 to the inlet port of the liquid circulation cooling component 35ba, a board pipe 34bb that guides the cooling water from the outlet port of the liquid circulation cooling component 35ba to the inlet port of the liquid circulation cooling component 35bb, and the board pipe 34bc which guides the cooling water from the outlet port of the liquid circulation cooling component 35bb to the return connection pipe 62.

Figure 6:
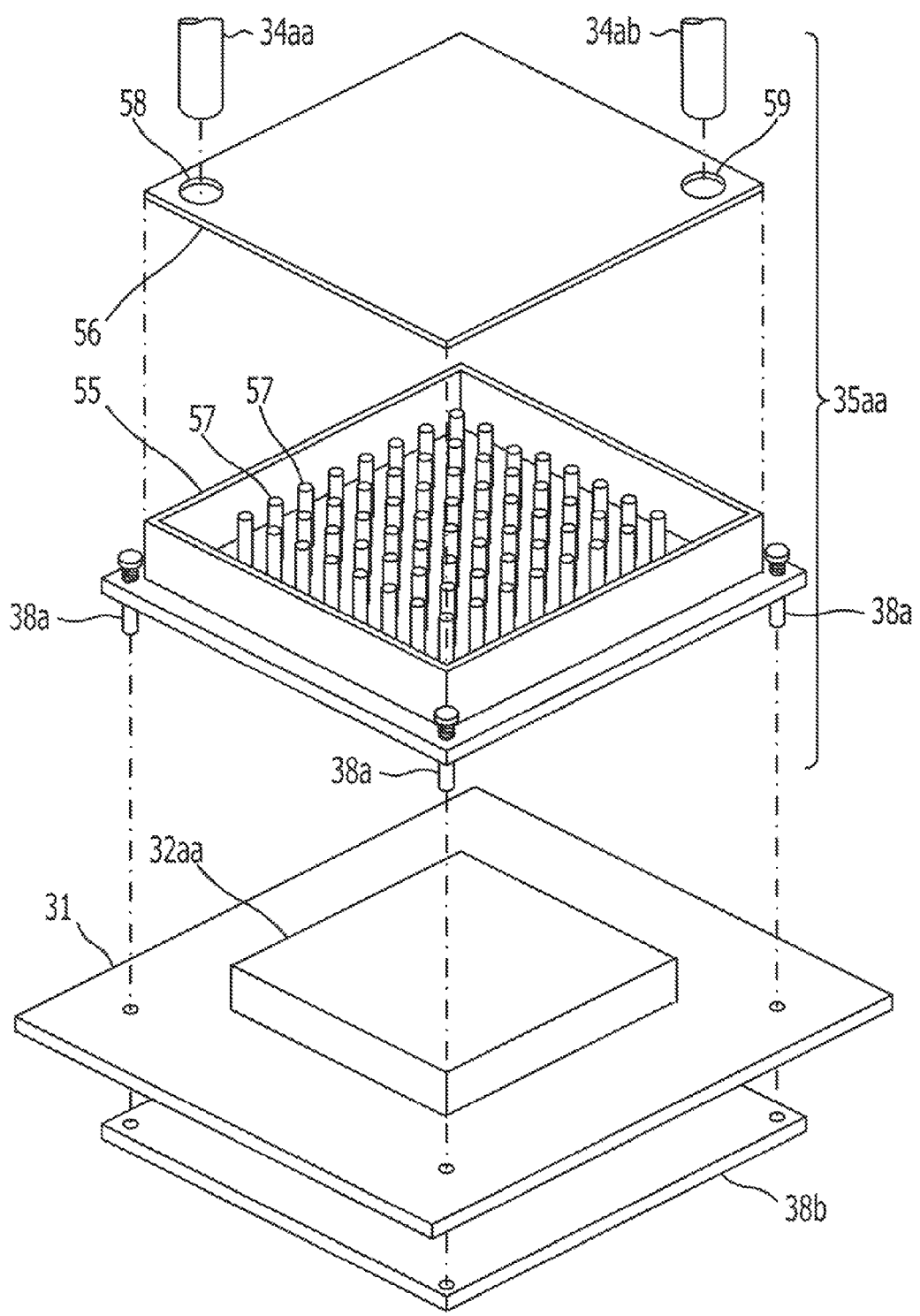
FIG. 6 is an exploded perspective view of a liquid circulation cooling component.

FIG. 6 is an exploded perspective view of the liquid circulation cooling component 35aa illustrated in FIG. 5. The liquid circulation cooling component 35aa includes a container 55 forming the lower wall and the side walls of the liquid circulation cooling component 35aa, a lid portion 56 joined on top of the container 55 to form the upper wall of the liquid circulation cooling component 35aa, and a plurality of columnar pin fins 57 provided to stand on the inner wall surface of the lower wall of the container 55. The lid portion 56 has an inlet port 58 and an outlet port 59 that are each an opening. The board pipe 34aa is connected to the inlet port 58. The board pipe 34ab is connected to the outlet port 59. The cooling water flowing into the liquid circulation cooling component 35aa via the inlet port 58 flows between the pin fins 57 to flow out via the outlet port 59. Heat from the chip component 32aa is transferred to the cooling water via the pin fins 57. A plurality of inlet ports 58 and a plurality of outlet ports 59 may be provided. The inlet port 58 may be provided at the center of the lid portion 56.

The liquid circulation cooling component 35aa is attached to the main substrate 31 using fixation members 38a and a fixation plate 38b. That is, lower portions of the fixation members 38a penetrate through the container 55 and the main substrate 31 to be fixed to the fixation plate 38b located below the main substrate 31. Upper portions of the fixation members 38a each include an elastic element, which applies a downward force to the container 55. This allows the container 55, the chip component 32aa, and the main substrate 31 to be fixed by the fixation members 38a and the fixation plate 38b in a sandwiched manner. The upper flat surface portion of the chip component 32aa and the lower flat surface portion of the liquid circulation cooling component 35aa closely contact each other via grease or the like. The structure of the liquid circulation cooling components 35ab, 35ba, and 35bb is the same as the structure of the liquid circulation cooling component 35aa.

In the liquid-cooling mechanism for the system board 22 illustrated in FIG. 5 discussed above, the board pipe 34aa, the liquid circulation cooling component 35aa, the board pipe 34ab, the liquid circulation cooling component 35ab, and the board pipe 34ac form a first liquid flow path serving as a path for the flow of a liquid or the cooling water. Further, the board pipe 34ba, the liquid circulation cooling component 35ba, the board pipe 34bb, the liquid circulation cooling component 35bb, and the board pipe 34bc form a second liquid flow path serving as another path for the flow of a liquid or the cooling water.

The cooling water flowing from the feed pipe 24 into the first liquid flow path via the feed connection pipe 61 passes inside the liquid circulation cooling component 35aa via the board pipe 34aa to absorb heat from the chip component 32aa. Next, the cooling water from the liquid circulation cooling component 35aa passes inside the liquid circulation cooling component 35ab via the board pipe 34ab to absorb heat from the chip component 32ab. Next, the cooling water from the liquid circulation cooling component 35ba flows out from the first liquid flow path via the board pipe 34ac to the return pipe 25 via the return connection pipe 62. The chip components 32aa and 32ab are cooled by the first liquid flow path.

Similarly, the cooling water flowing from the feed pipe 24 into the second liquid flow path via the feed connection pipe 61 passes inside the liquid circulation cooling component 35ba via the board pipe 34ba to absorb heat from the chip component 32ba. Next, the cooling water from the liquid circulation cooling component 35ba passes inside the liquid circulation cooling component 35bb via the board pipe 34bb to absorb heat from the chip component 32bb. Next, the cooling water from the liquid circulation cooling component 35bb flows out from the second liquid flow path via the board pipe 34bc to the return pipe 25 via the return connection pipe 62. The chip components 32ba and 32bb are cooled by the second liquid flow path.

Next, the air-cooling mechanism for the system board 22 will be described with reference to FIGS. 4 and 5 discussed above.

Figure 7:
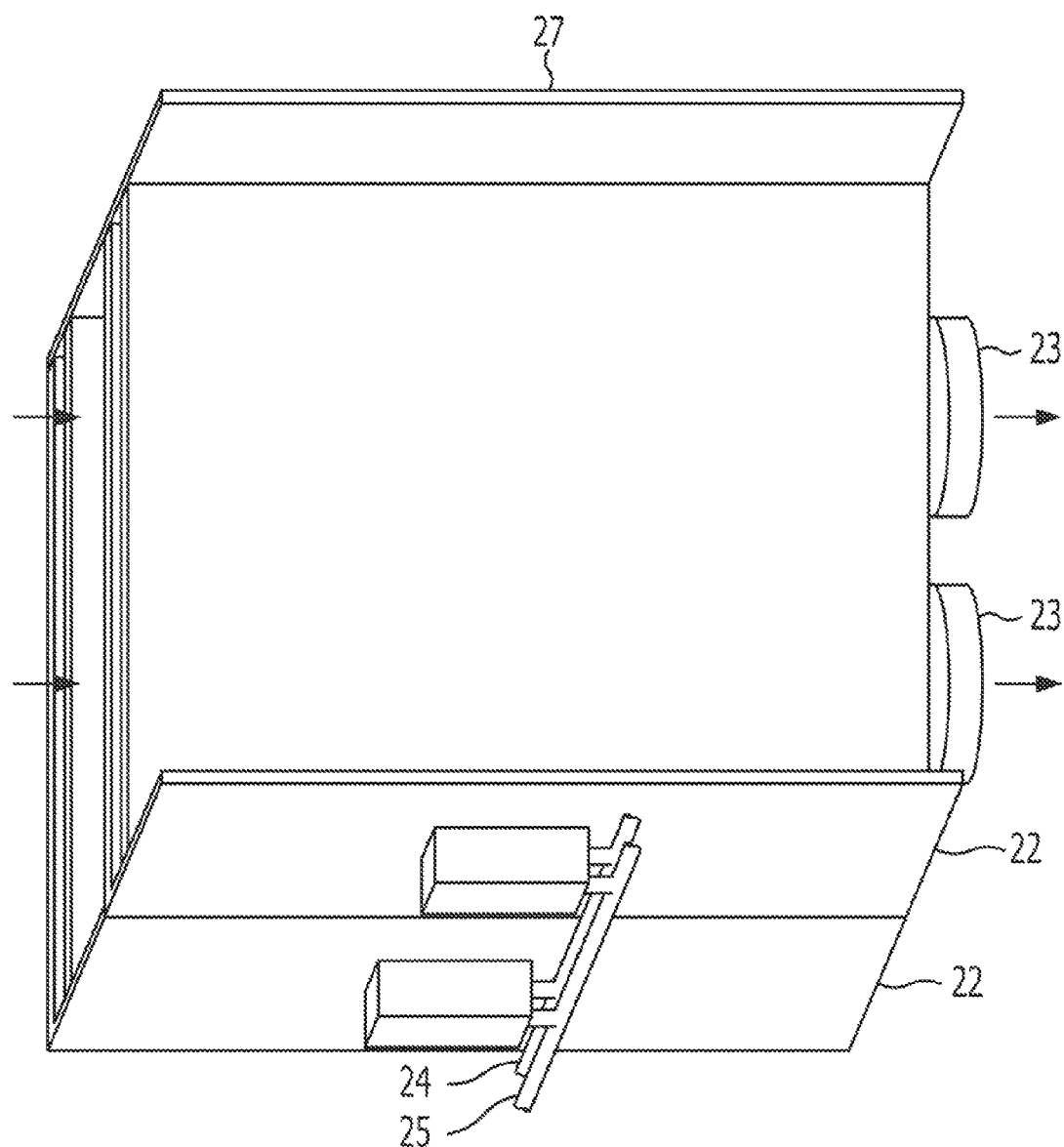
FIG. 7 is a perspective view of two system boards and two fans according to the first embodiment.

FIG. 7 is a perspective view of two system boards 22 and two fans 23 according to the first embodiment. As illustrated in FIGS. 2 and 7, the plurality of system boards 22 in the rack cabinet 14 are stacked in the height direction. As illustrated in FIG. 7, the two system boards 22 and the cabinet wall 27 form a tubular space having two openings. In relation to the uppermost system board 22, the system board 22, the upper wall of the rack cabinet 14, and the cabinet wall 27 form a tubular space having two openings. A tubular space is thus formed on each system board 22.

The arrows in FIGS. 5 and 7 indicate the direction of the flow of an air in the tubular space. As illustrated in FIGS. 2 and 7, a plurality of fans 23 are provided in one side surface of the rack cabinet 14 to exhaust air in the rack cabinet 14 to the exhaust ventilation path 48. This allows the air to flow from the intake ventilation path 47 into the tubular space via the opening of the tubular space opposite the fans 23 discussed above, to flow in the tubular space from the opening opposite the fans 23 to the opening on the side of the fans 23, and to flow out from the tubular space to the exhaust ventilation path 48 via the opening of the tubular space on the side of the fans 23.

As illustrated in FIG. 5 discussed above, the tubular space is partitioned by a plurality of fins 36aa, partition plates 37aa and 37ab, a plurality of fins 36ca, partition plates 37ba and 37bb, and a plurality of fins 36ba. In this way, of the tubular space, spaces between the plurality of fins 36aa, a space between the partition plates 37aa and 37ab, spaces between the plurality of fins 36ca, a space between the partition plates 37ba and 37bb, and spaces between the plurality of fins 36ba form a first air flow path serving as a path for the flow of a air or the air. The air flowing from the intake ventilation path 47 into the rack cabinet 14 flows into the first air flow path via an end portion of the system board 22 on the intake ventilation path 47 side, flows out from the first air flow path via an end portion of the system board 22 on the exhaust ventilation path 48 side, and is caused to flow out from inside the rack cabinet 14 to the exhaust ventilation path 48 by the fan 23. The sub substrates 33aa and 33ba are positioned in the first air flow path. The board pipes 34ab, 34ac, 34bb, and 34bc traverse the inside of the first air flow path.

The system board 22 further includes the partition plate 37aa which is a flat plate provided between the chip component 32aa and the sub substrates 33aa to extend in parallel with the sub substrates 33aa, the partition plate 37ab which is a flat plate provided between the chip component 32ab and the sub substrates 33aa to face the partition plate 37aa, the partition plate 37ba which is a flat plate provided between the chip component 32ba and the sub substrates 33ba to extend in parallel with the sub substrates 33ba, and the partition plate 37bb which is a flat plate provided between the chip component 32bb and the sub substrates 33ba to face the partition plate 37ba.

The system board 22 further includes the plurality of fins 36aa which are flat plates joined onto the outer wall of the board pipe 34ab, the plurality of fins 36ba which are flat plates joined onto the outer wall of the board pipe 34bb, and the plurality of fins 36ca which are flat plates joined onto the outer walls of the board pipes 34ac and 34bc. The plurality of fins 36aa, 36ba, and 36ca are disposed in parallel with the sub substrates 33aa and 33ba, and arranged at fin intervals in the direction in which the sub substrates 33aa and 33ba are arranged. The fins 36aa are provided upstream of the sub substrates 33aa in the first air flow path. The fins 36ca are provided downstream of the sub substrates 33aa and upstream of the sub substrates 33ba in the first air flow path. The fins 36ba are provided downstream of the sub substrates 33ba in the first air flow path.

In the first air flow path illustrated in FIG. 5 discussed above, the distance over which the plurality of fins 36aa are arranged, the interval between the partition plate 37aa and the partition plate 37ab, the distance over which the plurality of fins 36ca are arranged, the interval between the partition plate 37ba and the partition plate 37bb, and the distance over which the plurality of fins 36ba are arranged are the same as each other. This allows the first air flow path to have a constant width over the path, which allows air to flow efficiently. In the case where the first air flow path can be formed by other components, the partition plates 37aa, 37ab, 37ba, and 37bb may be omitted.

A cooperative operation of the liquid-cooling mechanism and the air-cooling mechanism for the system board 22 will be described below.

In the example, the temperature of the cooling water flowing in the board pipe 34ab should be lower than the temperature of the air flowing between the plurality of fins 36aa. Further, the temperature of the cooling water flowing in the board pipe 34ac and the board pipe 34bc should be lower than the temperature of the air flowing between the plurality of fins 36ca. Further, the temperature of the cooling water flowing in the board pipe 34bb should be lower than the temperature of the air flowing between the plurality of fins 36ba.

In the first air flow path, first, part of heat of the air flowing between the plurality of fins 36aa is transferred to the cooling water flowing in the board pipe 34ab. Next, part of heat of the plurality of sub substrates 33aa is transferred to the air flowing between the partition plate 37aa and the partition plate 37ab. Next, part of heat of the air flowing between the plurality of fins 36ca is transferred to the cooling water flowing in the board pipes 34ac and 34bc. Next, part of heat of the plurality of sub substrates 33ba is transferred to the air flowing between the partition plate 37ba and the partition plate 37bb. Next, part of heat of the air flowing between the plurality of fins 36ba is transferred to the cooling water flowing in the board pipe 34bb.

Example results of comparing the first embodiment with a comparative example will be described below.

Figure 8:
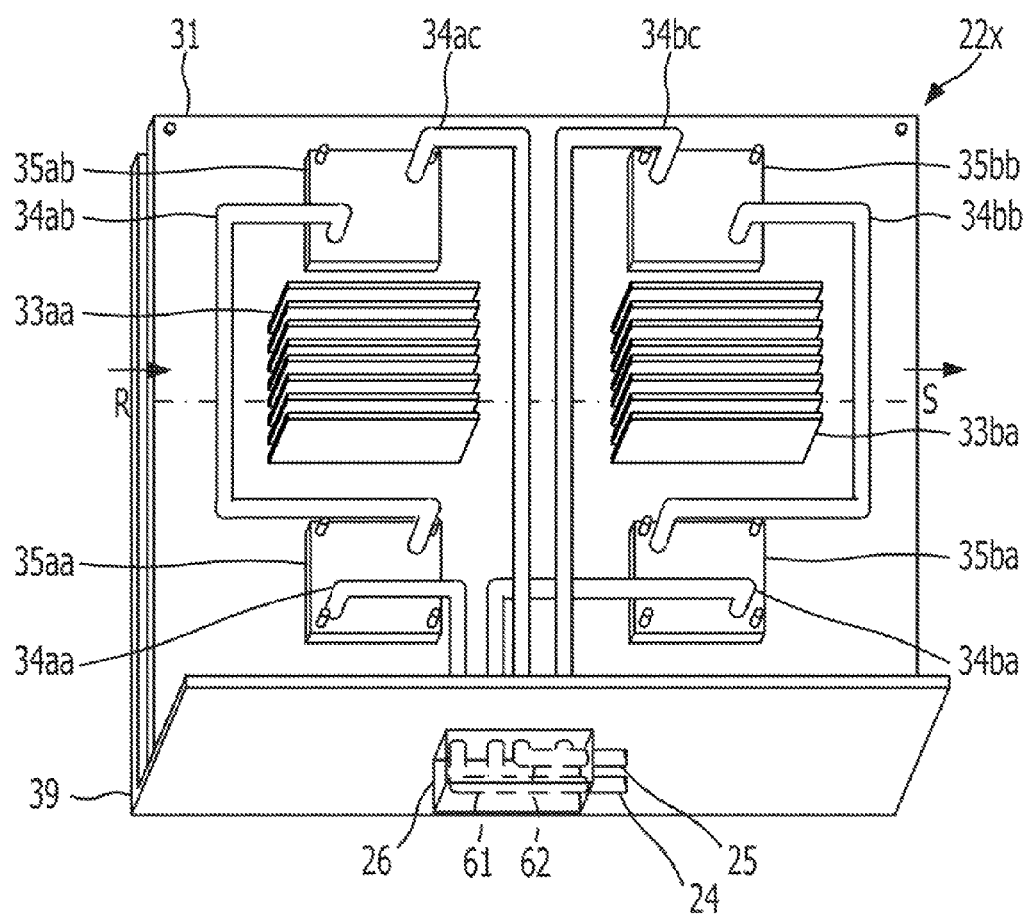
FIG. 8 is a perspective view of a system board and a liquid-cooling mechanism according to a comparative example.

A data center according to the comparative example includes system boards 22x, a liquid-cooling mechanism and an air-cooling mechanism which do not perform a cooperative operation, in place of the system boards 22. FIG. 8 is a perspective view of the system board 22x and the liquid-cooling mechanism according to the comparative example. Reference numerals for the system board 22x that are identical to those for the system board 22 denote components that are identical or equivalent to those for the system board 22, and will not be described here for the sake of brevity. The system board 22x does not include the fins 36aa, 36ba, or 36ca or the partition plate 37aa, 37ab, 37ba, or 37bb.

On the system board 22x according to the comparative example, a position R indicates a position that is at an end portion of the first air flow path on the intake ventilation path 47 side and that is closest to the center of the sub substrates 33aa, and a position S indicates a position that is at an end portion of the first air flow path on the exhaust ventilation path 48 side and that is closest to the center of the sub substrates 33ba. Similarly, on the system board 22 according to the first embodiment, a position P indicates a position that is at an end portion of the first air flow path on the intake ventilation path 47 side and that is closest to the center of the sub substrates 33aa, and a position Q indicates a position that is at an end portion of the first air flow path on the exhaust ventilation path 48 side and that is closest to the center of the sub substrates 33ba.

Figure 9:
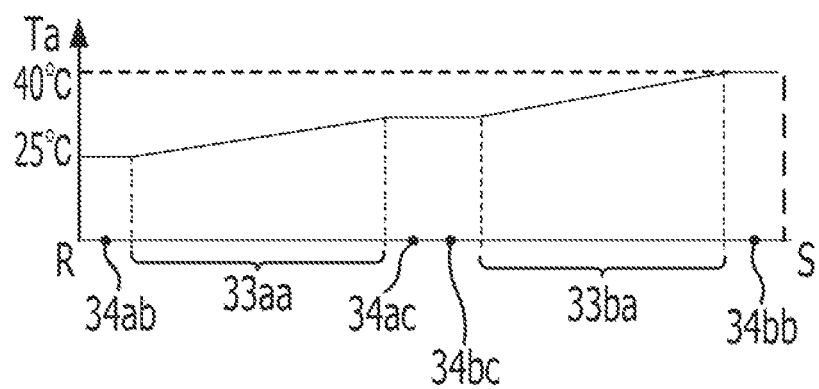
FIG. 9 illustrates the temperature increment of the cooling air on the system board according to the comparative example.

FIG. 9 is a graph illustrating a temperature increment of the cooling air on the system board 22x according to the comparative example. In FIG. 9, the horizontal axis represents the position on the line segment RS, and the vertical axis represents the temperature Ta of the air. The symbols on the horizontal axis respectively represent the positions of the board pipe 34ab, the sub substrates 33aa, the board pipe 34ac, the board pipe 34bc, the sub substrates 33ba, and the board pipe 34bb from the left. The arrows in FIG. 8 indicate the direction of the air flow on the system board 22x.

First, the air flowing in from the position R onto the system board 22x passes near the board pipe 34ab, and absorbs heat from the plurality of sub substrates 33aa as the air flows between the sub substrates 33aa. Next, the air passes near the board pipe 34ac and the board pipe 34bc, and absorbs heat from the plurality of sub substrates 33ba as the air flows between the sub substrates 33*ba*. Next, the air passes near the board pipe 34*bb*, and flows out of the system board 22*x* from the position S. As a result, the temperature of the air at the position S at which the air flows out becomes higher than the temperature of the air at the position R at which the air flows in. That is, the temperature of the air is raised significantly as the air passes over the system board 22*x*. According to an example of the measurement results, the temperature of the air at the position R at which the air flows in is 25° C., and the temperature of the air at the position S at which the air flows out is 40° C. Thus, in the computer room 12 including a large number of system boards 22*x*, the air conditioner 13 is required to cool air at 40° C.

Figure 10:
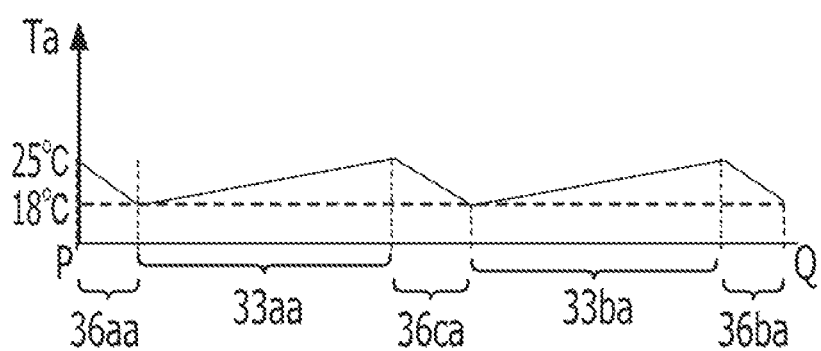
FIG. 10 illustrates the temperature increment of the cooling air on the system board according to the first embodiment.

FIG. 10 is a graph illustrating the temperature change of air on the system board 22 according to the first embodiment. In FIG. 10, the horizontal axis represents the position on the line segment PQ, and the vertical axis represents the temperature Ta of the air. The symbols on the horizontal axis respectively represent the positions of the fins 36*aa*, the sub substrates 33*aa*, the fins 36*ca*, the sub substrates 33*ba*, and the fins 36*ba* from the left.

First, the air flowing in from the position P onto the system board 22 emits heat to the plurality of fins 36*aa* as the air flows through the spaces between the fins 36*aa*. Next, the air absorbs heat from the plurality of sub substrates 33*aa* as the air flows through the spaces between the sub substrates 33*aa*. Next, the air emits heat to the plurality of fins 36*ca* as the air flows through the spaces between the fins 36*ca*. Next, the air absorbs heat from the plurality of sub substrates 33*ba* as the air flows through the spaces between the sub substrates 33*ba*. Next, the air emits heat to the plurality of fins 36*ba* as the air flows through the spaces between the fins 36*ba*. Next, the air flows out of the system board 22 from the position Q. As a result, the temperature of the air at the position Q at which the air flows out becomes lower than the temperature of the air at the position P at which the air flows in. That is, the temperature of the air is lowered as the air passes over the system board 22. According to an example of the measurement results, the temperature of the air at the position P at which the air flows in is 25° C., and the temperature of the air at the position Q at which the air flows out is 18° C. Thus, in the computer room 12 including a large number of system boards 22, the capacity of the air conditioner 13 and the amount of electric power consumed by the air conditioner 13 can be reduced compared to the comparative example.

On the system board 22, the fins 36*aa* and the board pipe 34*ab* transfer heat of the air to the cooling water, thereby reducing the temperature of the air around the sub substrates 33*aa* and 33*ba* positioned downstream of the fins 36*aa* in the first air flow path. This improves the cooling efficiency for the sub substrates 33*aa* and 33*ba*. Similarly, on the system board 22, the fins 36*ca* and the board pipes 34*ac* and 34*bc* transfer heat of the air to the cooling water, thereby reducing the temperature of the air passing between the sub substrates 33*ba* positioned downstream of the fins 36*ca* in the first air flow path. This improves the cooling efficiency for the sub substrates 33*ba*. By improving the cooling efficiency for components on the system board 22 in this way, components can be mounted on the system board 22 at a further higher density.

With the system board 22 transferring heat of the air to the cooling water, the load on the air conditioner 13 for cooling the air is reduced compared to the comparative example, but the load on the cooling water chiller 11 for cooling the water may be increased compared to the comparative example. However, the cooling efficiency of the cooling water chiller 11 is generally much higher than the cooling efficiency of the air conditioner 13. Thus, the amount of electric power consumed by the entire cooling mechanism, which includes both the liquid-cooling mechanism and the air-cooling mechanism, for the data center according to the first embodiment may be reduced compared to the data center according to the comparative example.

Second Embodiment

Electronic circuit components on a system board, a liquid-cooling mechanism, and an air-cooling mechanism according to a second embodiment will be described below. A data center according to the second embodiment includes system boards 22*b* in place of the system boards 22 in the data center according to the first embodiment.

First, the electronic circuit components on the system board 22*b* will be described.

Figure 11:
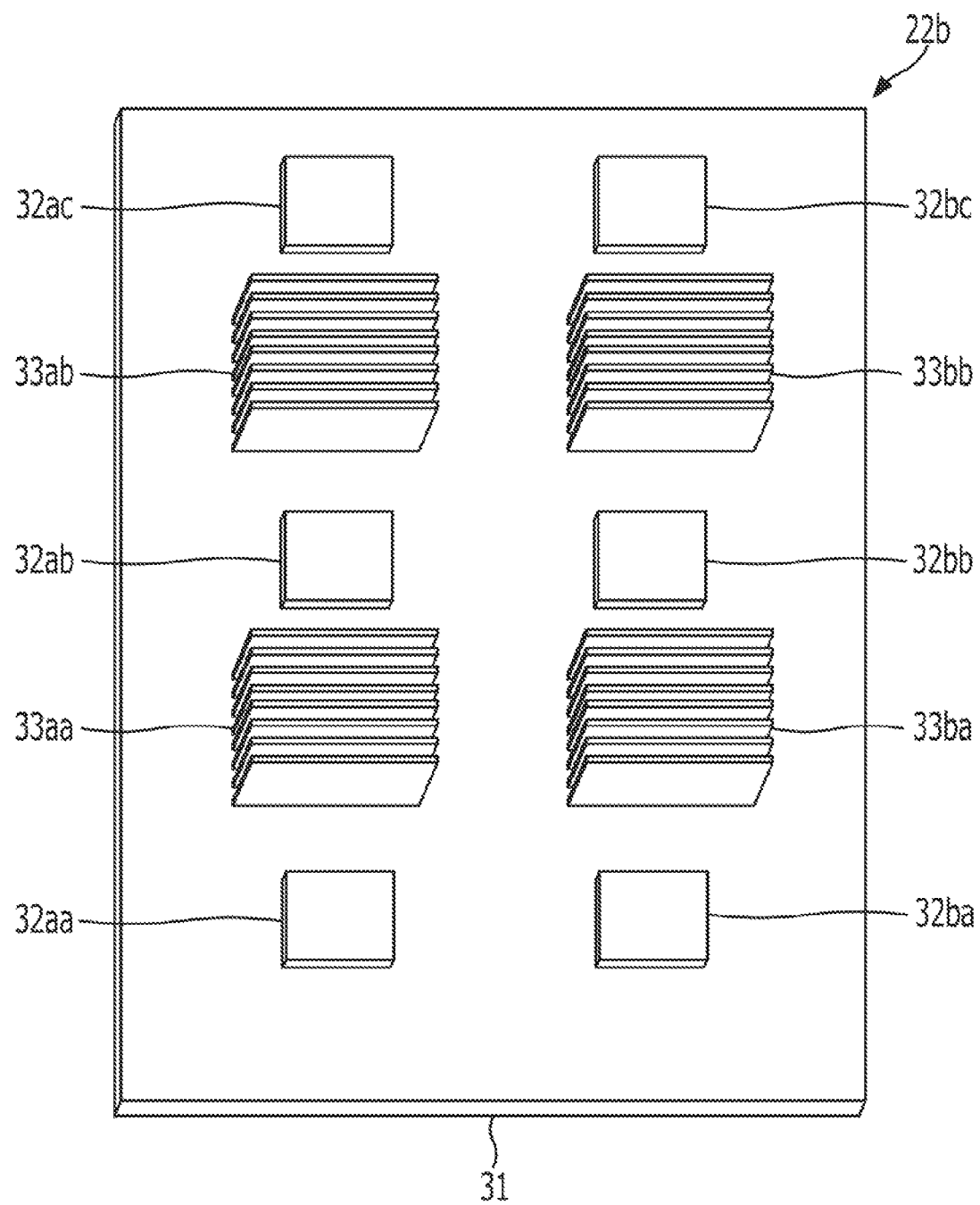
FIG. 11 is a perspective view illustrating the arrangement of electronic circuit components on a system board according to a second embodiment.
Figure 12:
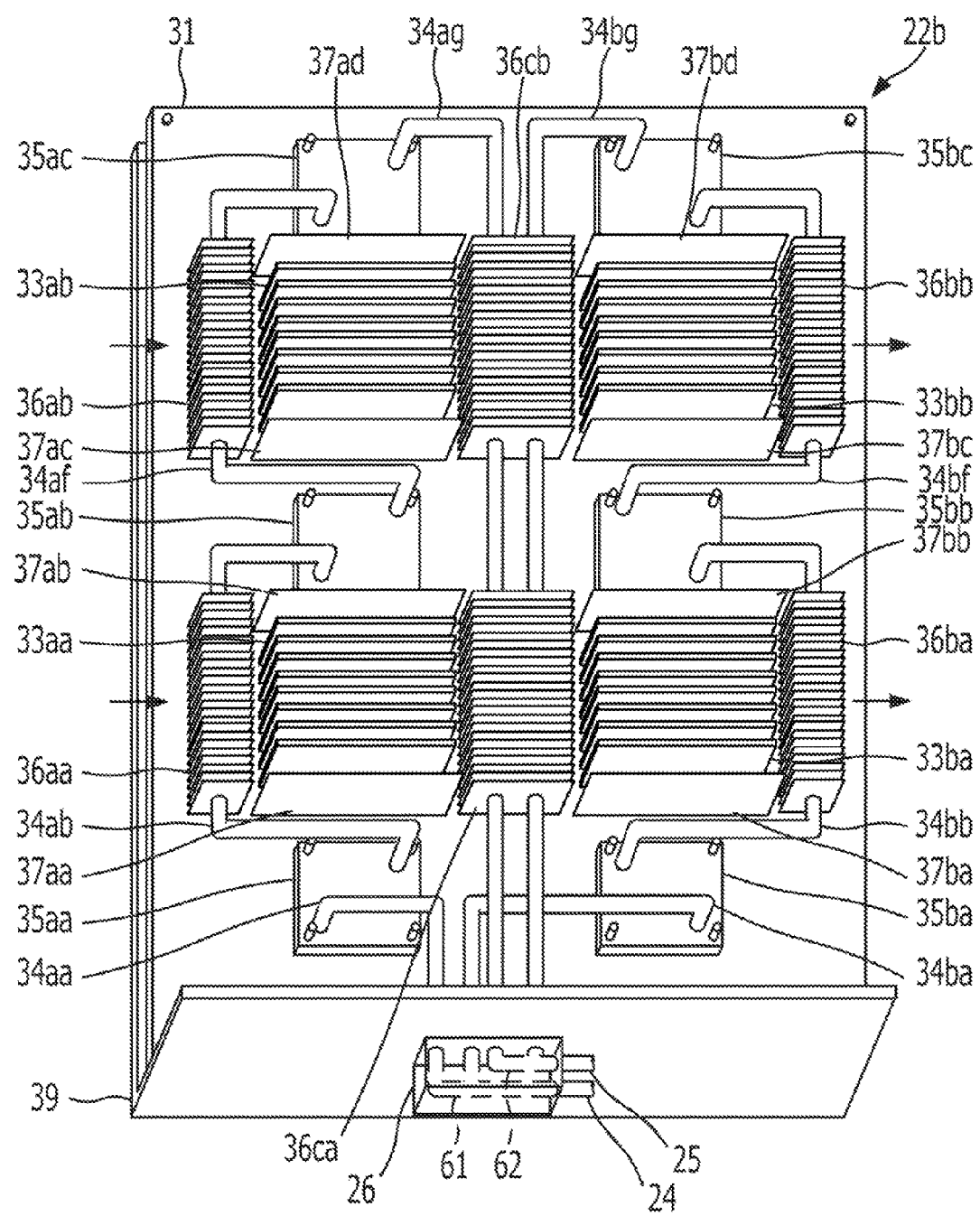
FIG. 12 is a perspective view of the system board and a liquid-cooling mechanism according to the second embodiment.

FIG. 11 is a perspective view illustrating the arrangement of the electronic circuit components on the system board 22*b* according to the second embodiment. FIG. 12 is a perspective view of the system board 22*b* and the liquid-cooling mechanism according to the second embodiment. Reference numerals for the system board 22*b* that are identical to those for the system board 22 denote components that are identical or equivalent to those for the system board 22, and will not be described here for the sake of brevity. As illustrated in FIG. 11, the system board 22*b* includes, in addition to the components of the system board 22, chip components 32*ac* and 32*bc* that are similar to the chip component 32*aa* and that are provided on the main substrate 31. The chip component 32*ac* is provided opposite the chip component 32*aa* with respect to the chip component 32*ab*. The chip component 32*bc* is provided opposite the chip component 32*bc* with respect to the chip component 32*bb*. The system board 22*b* further includes a plurality of sub substrates 33*ab* and 33*bb* that are similar to the sub substrates 33*aa* and that are provided vertically with respect to the main substrate 31. The plurality of sub substrates 33*ab* are disposed in parallel with each other between the chip component 32*ab* and the chip component 32*ac*, and arranged in the direction of a line connecting the chip component 32*ab* and the chip component 32*ac* at sub substrate intervals. The plurality of sub substrates 33*bb* are disposed in parallel with each other between the chip component 32*bb* and the chip component 32*bc*, and arranged in the direction of a line connecting the chip component 32*bb* and the chip component 32*bc* at sub substrate intervals.

Next, the liquid-cooling mechanism for the system board 22*b* will be described.

As illustrated in FIG. 12, the system board 22*b* is provided with components similar to those of the system board 22. The system board 22*b* is further provided with liquid circulation cooling components 35*ac* and 35*bc* that have a structure similar to that of the liquid circulation cooling component 35*aa* and that closely contact the respective upper flat surface portions of the chip components 32*ac* and 32*bc* illustrated in FIG. 11.

In place of the board pipes 34*ac* and 34*bc* on the system board 22, the system board 22*b* is provided with a board pipe 34*af* that guides the cooling water from the outlet port of the liquid circulation cooling component 35*ab* to the inlet port of the liquid circulation cooling component 35*ac*, a board pipe 34*ag* that guides the cooling water from the outlet port of the liquid circulation cooling component 35*ac* to the return connection pipe 62, a board pipe 34*bf* that guides the cooling water from the outlet port of the liquid circulation cooling component 35*bb* to the inlet port of the liquid circulation cooling component 35*bc*, and a board pipe 34*bg* that guides the cooling water from the outlet port of the liquid circulation cooling component 35bc to the return connection pipe 62.

In the liquid-cooling mechanism for the system board 22b illustrated in FIG. 12 discussed above, the board pipe 34aa, the liquid circulation cooling component 35aa, the board pipe 34ab, the liquid circulation cooling component 35ab, the board pipe 34af, the liquid circulation cooling component 35ac, and the board pipe 34ag form a first liquid flow path serving as a path for the flow of a liquid or the cooling water. Further, the board pipe 34ba, the liquid circulation cooling component 35ba, the board pipe 34bb, the liquid circulation cooling component 35bb, the board pipe 34bf, the liquid circulation cooling component 35bc, and the board pipe 34bg form a second liquid flow path serving as another path for the flow of a liquid or the cooling water.

The cooling water flowing from the feed pipe 24 into the first liquid flow path via the feed connection pipe 61 passes inside the liquid circulation cooling component 35aa via the board pipe 34ag to absorb heat from the chip component 32aa. Next, the cooling water from the liquid circulation cooling component 35aa passes inside the liquid circulation cooling component 35ab via the board pipe 34ab to absorb heat from the chip component 32ab. Next, the cooling water from the liquid circulation cooling component 35ab passes inside the liquid circulation cooling component 35ac via the board pipe 34af to absorb heat from the chip component 32ac. Next, the cooling water from the liquid circulation cooling component 35ac flows out from the first liquid flow path via the board pipe 34ag to flow out to the return pipe 25 via the return connection pipe 62. The chip components 32aa, 32ab, and 32ac are cooled by the first liquid flow path.

The cooling water flowing from the feed pipe 24 into the second liquid flow path via the feed connection pipe 61 passes inside the liquid circulation cooling component 35ba via the board pipe 34ba to absorb heat from the chip component 32ba. Next, the cooling water from the liquid circulation cooling component 35ba passes inside the liquid circulation cooling component 35bb via the board pipe 34bb to absorb heat from the chip component 32bb. Next, the cooling water from the liquid circulation cooling component 35bb passes inside the liquid circulation cooling component 35bc via the board pipe 34bf to absorb heat from the chip component 32bc. Next, the cooling water from the liquid circulation cooling component 35bc flows out from the second liquid flow path via the board pipe 34bg to flow out to the return pipe 25 via the return connection pipe 62. The chip components 32ba, 32bb, and 32bc are cooled by the second liquid flow path.

Next, the air-cooling mechanism for the system board 22b will be described with reference to FIGS. 10 and 12 discussed above.

In the same way as illustrated in FIG. 7, a tubular space is formed on each system board 22b. The arrows in FIG. 12 indicate the direction of the flow of a air in the tubular space. As illustrated in FIG. 12 discussed above, of the tubular space, spaces between the plurality of fins 36aa, a space between the partition plates 37ac and 37ab, spaces between the plurality of fins 36ca, a space between the partition plates 37bc and 37bb, and spaces between the plurality of fins 36ba form a first air flow path serving as a path for the flow of a air or the air, as with the system board 22. Further, the tubular space is partitioned by a plurality of fins 36ab, partition plates 37ac and 37ad, a plurality of fins 36cb, partition plates 37bc and 37bd, and a plurality of fins 36bb. In this way, of the tubular space, spaces between the plurality of fins 36ab, a space between the partition plates 37ac and 37ad, spaces between the plurality of fins 36cb, a space between the partition plates 37bc and 37bd, and spaces between the plurality of fins 36bb form a second air flow path serving as a path for the flow of a air or the air and extending in parallel with the first air flow path.

The air flowing from the intake ventilation path 47 into the rack cabinet 14 flows into the first air flow path or the second air flow path via an end portion of the system board 22b on the intake ventilation path 47 side, flows out from the first air flow path or the second air flow path via an end portion of the system board 22b on the exhaust ventilation path 48 side, and is caused to flow out from inside the rack cabinet 14 to the exhaust ventilation path 48 by the fan 23. The sub substrates 33ab and 33bb are positioned in the second air flow path. The board pipes 34ab, 34ag, 34bb, and 34bg traverse the inside of the first air flow path. The board pipes 34af, 34ag, 34bf, and 34bg traverse the inside of the second air flow path.

The system board 22b further includes the partition plates 37ac, 37ad, 37bc, and 37bd which are each a flat plate that is similar to the partition plate 37aa. The partition plate 37ac is provided between the chip component 32ab and the sub substrates 33ab to extend in parallel with the sub substrates 33ab. The partition plate 37bc is provided between the chip component 32bb and the sub substrates 33bb to extend in parallel with the sub substrates 33bb. The partition plate 37ad is provided between the chip component 32ac and the sub substrates 33ab to face the partition plate 37ac. The partition plate 37bd is provided between the chip component 32bc and the sub substrates 33bb to face the partition plate 37bc.

The system board 22b further includes the plurality of fins 36ab which are flat plates joined onto the outer wall of the board pipe 34af, the plurality of fins 36bb which are flat plates joined onto the outer wall of the board pipe 34bf, and the plurality of fins 36cb which are flat plates joined onto the outer walls of the board pipes 34ag and 34bg. The plurality of fins 36ab, 36bb, and 36cb are arranged at fin intervals in the direction in parallel with the board pipes 34af, 34bf, 34ag, and 34gb. The fins 36ab are provided upstream of the sub substrates 33ab in the second air flow path. The fins 36cb are provided downstream of the sub substrates 33ab and upstream of the sub substrates 33bb in the second air flow path. The fins 36bb are provided downstream of the sub substrates 33bb in the second air flow path.

In the second air flow path illustrated in FIG. 12 discussed above, the distance over which the plurality of fins 36ab are arranged, the interval between the partition plate 37ac and the partition plate 37ad, the distance over which the plurality of fins 36cb are arranged, the interval between the partition plate 37bc and the partition plate 37bd, and the distance over which the plurality of fins 36bb are arranged are the same as each other. This allows the second air flow path to have a constant width over the path, which allows air to flow efficiently. In the case where the second air flow path can be formed by other components, the partition plates 37ac, 37ad, 37bc, and 37bd may be omitted.

A cooperative operation of the liquid-cooling mechanism and the air-cooling mechanism for the system board 22b will be described below.

In the example, the temperature of the cooling water flowing in the board pipe 34af should be lower than the temperature of the air flowing between the plurality of fins 36ab. Further, the temperature of the cooling water flowing in the board pipe 34ag and the board pipe 34bg should be lower than the temperature of the air flowing between the plurality of fins 36cb. Further, the temperature of the cooling water flowing in the board pipe 34bf should be lower than the temperature of the air flowing between the plurality of fins 36bb.

The function of the first air flow path is the same as that in the first embodiment. In the second air flow path, first, part of heat of the air flowing between the plurality of fins 36ab is transferred to the cooling water flowing in the board pipe 34af. Next, part of heat of the plurality of sub substrates 33ab is transferred to the air flowing between the partition plate 37ac and the partition plate 37ad. Next, part of heat of the air flowing between the plurality of fins 36cb is transferred to the cooling water flowing in the board pipes 34ag and 34bg. Next, part of heat of the plurality of sub substrates 33bb is transferred to the air flowing between the partition plate 37bc and the partition plate 37bd. Next, part of heat of the air flowing between the plurality of fins 36bb is transferred to the cooling water flowing in the board pipe 34bf.

On the system board 22b, the fins 36ab and the board pipe 34af transfer heat of the air to the cooling water, thereby reducing the temperature of the air around the sub substrates 33ab and 33bb positioned downstream of the fins 36ab in the second air flow path. This improves the cooling efficiency for the sub substrates 33ab and 33bb. Similarly, on the system board 22b, the fins 36cb and the board pipes 34ag and 34bg transfer heat of the air to the cooling water, thereby reducing the temperature of the air passing between the sub substrates 33bb positioned downstream of the fins 36cb in the second air flow path. This improves the cooling efficiency for the sub substrates 33bb. By improving the cooling efficiency for components on the system board 22b in this way, components can be mounted on the system board 22b at a further higher density.

The material of the liquid circulation cooling components 35aa, 35ab, 35ba, 35bb, 35ac, and 35bc, the board pipes 34aa, 34ab, 34ac, 34ba, 34bb, 34bc, 34af, 34bf, 34ag, and 34bg, and the fins 36aa, 36ba, 36ca, 36ab, 36bb, and 36cb is a material with a heat conductivity that is sufficiently higher than that of the cooling water such as copper or aluminum, for example.

On the system boards 22 and 22b, part of heat of the air may be transferred to the cooling water at least one portion in the first air flow path to lower the temperature of the air. Likewise, on the system board 22b, part of heat of the air may be transferred to the cooling water at least one portion in the second air flow path to lower the temperature of the air. On the system boards 22 and 22b, the temperature of the air after passing through the first air flow path may not be lower than the temperature of the air before passing through the first air flow path as long as part of the heat of the air can be transferred to the cooling water as the air passes through the first air flow path. Likewise, on the system board 22b, the temperature of the air after passing through the second air flow path may not be lower than the temperature of the air before passing through the second air flow path as long as part of the heat of the air can be transferred to the cooling water as the air passes through the second air flow path. In the examples discussed above, two paths for the cooling water are provided on each of the system boards 22 and 22b. However, the number of paths for the cooling water on each of the system boards 22 and 22b may be varied from one to many. The number of chip components on each of the system boards 22 and 22b may be varied from one to many. The number of sub substrates on each of the system boards 22 and 22b may be varied from one to many.

In the examples discussed above, the chip components on the system board are cooled by the cooling water, and the sub substrates are cooled by the air. However, the chip components may be cooled by both the cooling water and the air. In this case, at least portions of the liquid circulation cooling components which closely contact the chip components may be provided in a path for the air, and fins may be provided on the outer walls of such portions of the liquid circulation cooling components, for example.

A first high density heat dissipation component and a first heat-generating element may include any of the chip components 32aa, 32ab, 32ba, 32bb, 32ac, and 32bc, for example. A second high density heat dissipation component and a second heat-generating element may include any of the sub substrates 33aa, 33ba, 33ab, and 33bb, for example. A path for a air may include any of the first air flow path and the second air flow path, for example. A pipe may include any of the board pipes 34aa, 34ab, 34ac, 34ba, 34bb, 34bc, 34af, 34bf, 34ag, and 34bg and the liquid circulation cooling components 35aa, 35ab, 35ba, 35bb, 35ac, and 35bc, for example. A first fin may be a fin positioned upstream of any of the sub substrates in the direction of a air flow, and may include any of the fins 36aa, 36ca, 36ab, and 36cb, for example. A second fin may be a fin positioned downstream of any of the sub substrates in the direction of a air flow, and may include any of the fins 36ba, 36ca, 36bb, and 36cb, for example. A heat-generating element may include any of the chip components 32aa, 32ab, 32ba, 32bb, 32ac, and 32bc, for example.

Another aspect of the present invention provides a cooling apparatus that cools a first high density heat dissipation component and a second high density heat dissipation component installed in an electronic device, the cooling apparatus including a conduit that contacts the first high density heat dissipation component and that allows a refrigerant to pass therethrough, and a fin that contacts the conduit and that is provided around the second high density heat dissipation component.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments of the present inventions has been described in detail, it should be understood that various changes, substitutions, and alterations could be made hereto without departing from the spirit and scope of the invention.

What is claimed is:

1. A cooling apparatus that cools a first heat dissipation component and a second heat dissipation component provided in a housing, the cooling apparatus comprising:
    a fan, included in the housing, that provides a forced air convection from a first opening toward a second opening;
    a first conduit that contacts the first heat dissipation component and that allows a coolant to pass there through; and
    a first fin structure, provided between the first heat dissipation component and the second heat dissipation component, that contacts the first conduit and that is provided on an upwind side of the second heat dissipation component.

2. The cooling apparatus according to claim 1, further comprising:
    a second conduit provided on a downwind side of the second heat dissipation component, the second conduit allowing the coolant to pass there through; and
    a second fin structure, provided in a portion of the second conduit, that guides the air convection from the second heat dissipation component.

3. The cooling apparatus according to claim 2, further comprising a plurality of plates provided on between the first fin structure and the second fin structure.

4. The cooling apparatus according to claim 1, wherein the entire of the first fin structure is provided between the first heat dissipation component and the second heat dissipation component.

5. The cooling apparatus according to claim 1, further comprising a plurality of plates provided on an downwind side of the first fin structure.

6. A cooling apparatus that cools a first heat dissipation element and a second heat dissipation element using a liquid by causing air convection, comprising:
- a first pipe having a portion that allows the coolant to circulate to the first heat-dissipating element, the portion is provided on an upwind side of an air flow, which is generated by a fan with respect to the heat-dissipating element; and
- a fin, provided between the first heat dissipation component and the second heat dissipation, guiding the air convection to the second heat-dissipating element, the fin is provided in the portion of the first pipe which is provided on the upwind side of the air flow.

7. The cooling apparatus according to claim 6, further comprising:
- a second pipe provided on a downwind side of the second heat dissipation component, the second pipe allowing the coolant to pass there through; and
- a second fin structure, provided in a portion of the second pipe, that guides the air convection from the second heat dissipation component.

8. The cooling apparatus according to claim 7, further comprising a plurality of plates provided on between the first fin structure and the second fin structure.

9. The cooling apparatus according to claim 6, wherein the entire of the first fin structure is provided between the first heat dissipation component and the second heat dissipation component.

10. The cooling apparatus according to claim 6, further comprising a plurality of plates provided on an downwind side of the first fin structure.

11. An electronic equipment comprising:
- a first heat-dissipating element provided on a substrate;
- a tubing system that contacts the first heat-dissipating element and that allows a liquid to pass there through;
- a first fin structure provided in a portion of the tubing system that is located in a path for air convection which is generated by a fan; and
- a second heat-dissipating element provided on the substrate and downstream of the first fin structure provided in the path and between the first heat dissipation component and the second heat dissipation.

12. The electronic equipment according to claim 11, wherein the tubing system includes a portion, provided on a downwind side of the second heat dissipation component, which allows the coolant to pass there through and a second fin structure, which guides the air convection from the second heat dissipation component, is provided in the portion of the tubing system.

13. The electronic equipment according to claim 12, further comprising a plurality of plates provided on between the first fin structure and the second fin structure.

14. The electronic equipment according to claim 11, wherein the entire of the first fin structure is provided between the first heat dissipation component and the second heat dissipation component.

15. The electronic equipment according to claim 11, further comprising a plurality of plates provided on an downwind side of the first fin structure.

* * * * *